US010088242B1

(12) United States Patent
Rivera et al.

(10) Patent No.: US 10,088,242 B1
(45) Date of Patent: Oct. 2, 2018

(54) VARIABLE THICKNESS HEAT PIPE

(71) Applicant: Google LLC, Mountain View, CA (US)

(72) Inventors: Felix Jose Alvarez Rivera, San Jose, CA (US); James Tanner, Los Gatos, CA (US); William Riis Hamburgen, Los Altos, CA (US)

(73) Assignee: Google LLC, Mountain View, CA (US)

( * ) Notice: Subject to any disclaimer, the term of this patent is extended or adjusted under 35 U.S.C. 154(b) by 267 days.

(21) Appl. No.: 14/809,412

(22) Filed: Jul. 27, 2015

Related U.S. Application Data

(63) Continuation of application No. 13/764,111, filed on Feb. 11, 2013, now Pat. No. 9,121,645.

(51) Int. Cl.
*G06F 1/16* (2006.01)
*H05K 5/00* (2006.01)
*H05K 7/00* (2006.01)
*F28D 15/04* (2006.01)

(52) U.S. Cl.
CPC .................................... *F28D 15/04* (2013.01)

(58) Field of Classification Search
CPC ............. G06F 1/20; G06F 1/203; G06F 1/206
USPC ........................................ 361/679.47, 679.52
See application file for complete search history.

(56) References Cited

U.S. PATENT DOCUMENTS 5,229,083 A * 7/1993 Bleil ....................... C30B 13/18 117/202
6,504,720 B2 * 1/2003 Furuya .................. H01L 23/427 165/104.33
6,827,133 B1 12/2004 Luo
7,518,861 B2 * 4/2009 Lev ......................... G06F 1/203 165/104.33
7,643,284 B2 1/2010 Nakamura
7,684,187 B1 * 3/2010 Meyer, IV .......... F28D 15/0233 165/104.33
7,740,054 B2 6/2010 Yang
7,903,402 B2 3/2011 Tomioka et al.
8,811,010 B2 8/2014 Wang et al.
8,891,234 B2 11/2014 Huang et al.
8,971,037 B2 3/2015 Kang
9,429,370 B1 * 8/2016 Thomsen ............ F28D 15/0275
2004/0201958 A1 10/2004 Lev
2005/0103477 A1 5/2005 Kim et al.
2005/0225943 A1 * 10/2005 Shih .................... F28D 15/0233 361/700
2006/0162901 A1 7/2006 Aizono et al.
2007/0131383 A1 * 6/2007 Hattori ................... B01D 46/10 165/11.2

(Continued)

*Primary Examiner* — Anthony Haughton
(74) *Attorney, Agent, or Firm* — Lerner, David, Littenberg, Krumholz & Mentlik, LLP

(57) ABSTRACT

In one aspect, a cooling system is provided for use in computing devices, such as laptops, cell phones, and tablet computers. The cooling system includes a heat spreader coupled to a radiator via a heat pipe having a midline. The heat pipe includes a first end portion longitudinally extending along the midline, a second end portion longitudinally extending along the midline, and a mid-portion longitudinally extending along the midline. The mid-portion is located between the first end portion and the second end portion and it has a thickness that is greater than the thicknesses of both the first portion and the second portion thereby reducing the overall thermal resistance of the heat pipe.

18 Claims, 9 Drawing Sheets

M
100
110
122
Left End-Portion Length - $L_1$
120
126
140
124
Mid-Portion Length - $L_2$
130
Right End-Portion Length - $L_3$

(56) References Cited

U.S. PATENT DOCUMENTS

| | | | | |
|---|---|---|---|---|
| 2009/0293461 | A1* | 12/2009 | Miyagawa | F01N 3/043 60/299 |
| 2010/0147502 | A1 | 6/2010 | Xu et al. | |
| 2010/0155030 | A1* | 6/2010 | Hwang | F28D 15/0233 165/104.26 |
| 2010/0181048 | A1 | 7/2010 | Hwang et al. | |
| 2010/0195280 | A1 | 8/2010 | Huang et al. | |
| 2011/0114294 | A1* | 5/2011 | Degner | H01L 23/4006 165/104.26 |
| 2012/0293958 | A1 | 11/2012 | Lee | |

* cited by examiner

VARIABLE THICKNESS HEAT PIPE

CROSS-REFERENCE TO RELATED APPLICATIONS

The present application is a continuation of U.S. patent application Ser. No. 13/764,111, filed Feb. 11, 2013, the disclosure of which is incorporated herein by reference.

BACKGROUND

Thin-profile devices such as laptops, tablets, and smart phones are becoming ever lighter and smaller. Such devices ordinarily include cooling systems that dissipate heat generated by their internal components. The cooling systems may include heat pipes, radiators, and cooling fans. In general, the thinner the profile of a device, the less room there is in the device's enclosure for those cooling systems to fit in. Thus, cooling systems that are used in thin-profile devices need to possess at least two characteristics that are somewhat at odds with one another, namely they should fit into tight spaces, and they should have sufficient cooling capacity in order to prevent the devices from overheating. Striking an appropriate balance between size and cooling capacity of a cooling system is one of the challenges designers of thin-profile devices face.

SUMMARY

In one aspect, a cooling system is provided that is suitable for use in thin-profile portable devices. The cooling system includes a heat spreader, a radiator and a heat pipe coupling to the heat spreader and the radiator. The heat pipe may have a midline therealong. The heat pipe includes a first end portion extending longitudinally along the midline, a second end portion extending longitudinally along the midline, and a mid-portion extending longitudinally along the midline. The first end portion connects to the heat spreader and has a first thickness. The second end portion connects to the radiator and has a second thickness. The mid-portion may be located between the first end portion and the second-end portion, and has a third thickness that is greater than the first thickness and the second thickness.

In one example, the heat pipe may further include a casing having a variable wall thickness and a wick enclosed in the casing. The casing has a greater wall thickness in the mid-portion of the heat pipe than in the either one of the first end portion and the second end portion. In another example, the first end portion may be disposed on a surface of the heat spreader. Starting at a location on the heat pipe where the first end portion ends and the mid-portion begins, the mid-portion juts below the edge of the heat spreader. The first end portion extends substantially up to an edge of the heat spreader where the surface ends.

In another aspect, an apparatus is provided that includes an enclosure having a first face and a second face opposite the first face, a heat-generating component disposed inside the enclosure between the first face and the second face, and a radiator disposed inside the enclosure between the first face and the second face. The apparatus includes a heat spreader that is in thermal contact with the heat generating component. The heat spreader is disposed between the heat generating component and the top face. The apparatus also includes a heat pipe. The heat pipe includes a first end portion extending longitudinally along the midline, a second end portion extending longitudinally along the midline and a mid-portion extending longitudinally along the midline. The first-end portion connects to the heat spreader and may be disposed on the heat spreader between the heat spreader and the first face. Connected to the radiator is the second end portion. The first end portion has a first thickness and the second end portion has a second thickness. The mid-portion that connects the first end portion and the second-end portion has a third thickness greater than either one of the first thickness and the second thickness.

In yet another aspect, an apparatus is provided that includes an enclosure having a first face and a second face opposite the first face. A circuit board may be disposed between the first face and the second face. One or more integrated circuits may be mounted on the circuit board. A heat spreader may be disposed on at least some of the one or more integrated circuits. The apparatus includes a radiator disposed inside the enclosure between the first face and the second face and a heat pipe disposed between the first face and the second face. The heat pipe has a midline therealong. The heat pipe includes a first end portion connected to the radiator, a second end portion connected to the heat spreader and a mid-portion connecting the first end portion and the second portion. The first end portion and second end portion extend longitudinally along the mid-line. The mid-portion extends longitudinally along the mid-line, and may extend further towards a surface of the circuit board than the first end portion and the second end portion.

In one example, the heat pipe further includes a casing that defines the first end portion and a wick enclosed in the casing. The second end portion, and the mid-portion, the casing having a uniform wall thickness.

DETAILED DESCRIPTION

Figure 1A:
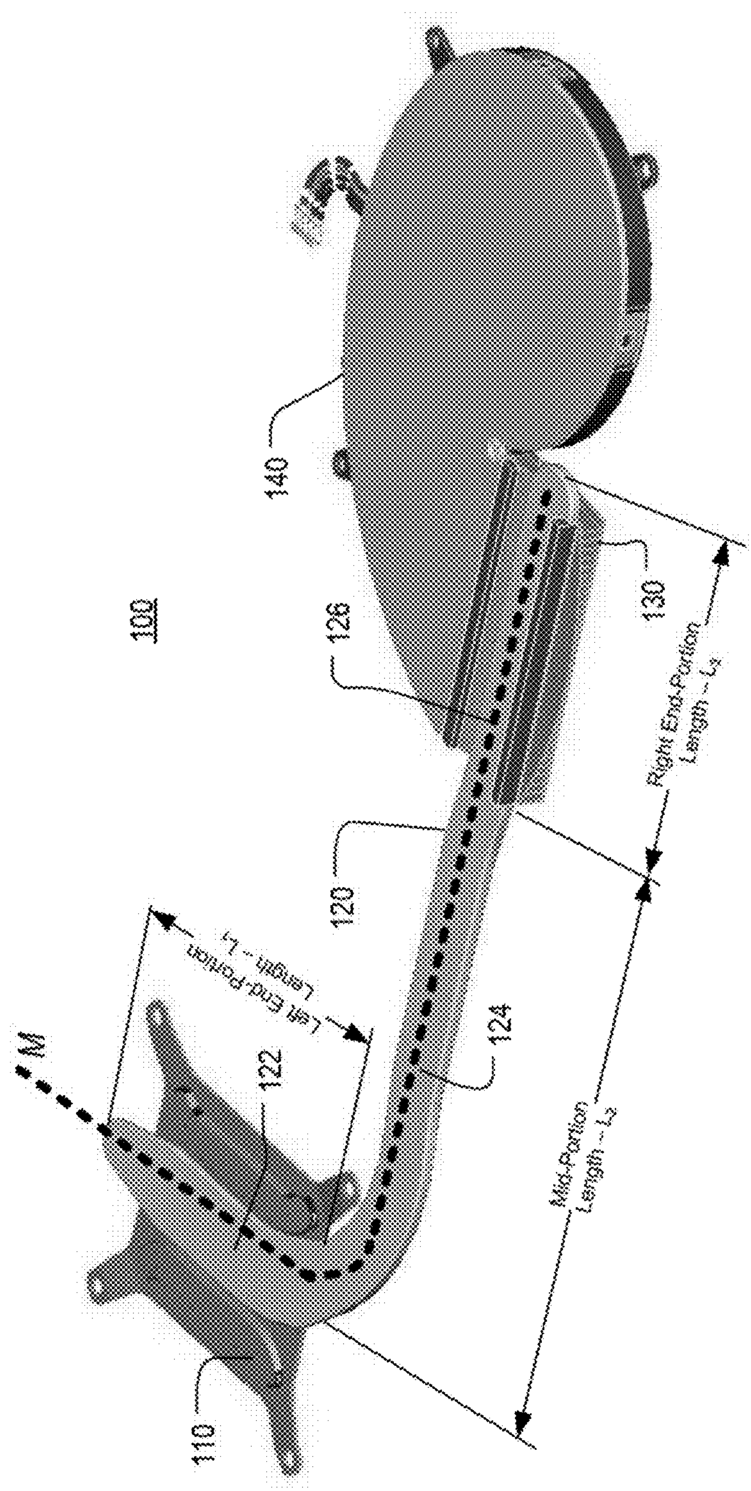
FIG. 1A depicts a perspective view of a cooling system in accordance with one aspect of the disclosure.
Figure 1B:
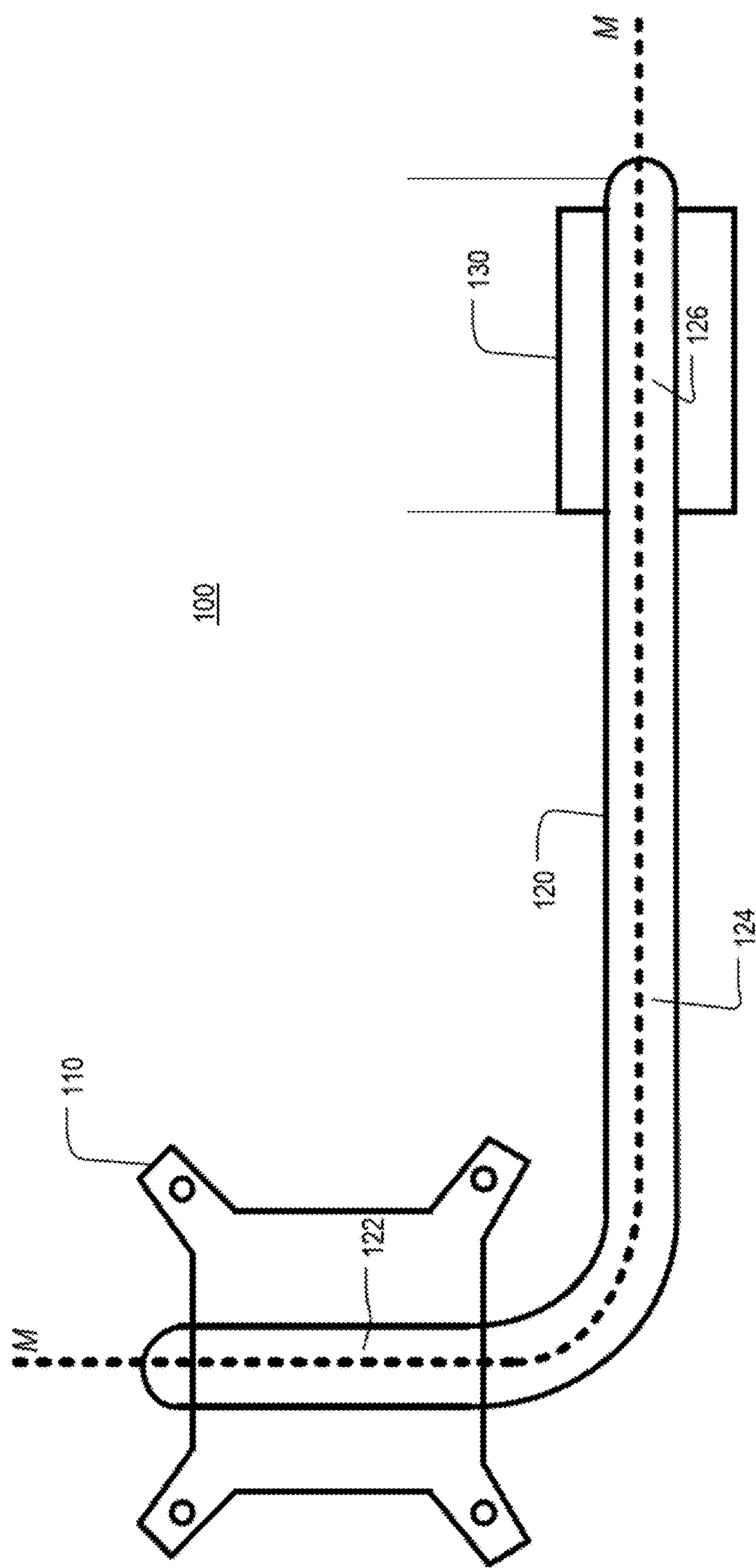
FIG. 1B depicts a top view of the cooling system of FIG. 1A.

FIGS. 1A-B depict a cooling system 100 in accordance with aspects of the disclosure. FIG. 1A depicts a perspective view of the system 100 and FIG. 1B depicts a top down view of the system 100. As illustrated, the cooling system 100 includes a heat spreader 110 coupled to a radiator 130 via a heat pipe 120. The heat spreader 110 may be a metal plate, or any other heat-exchanger that is used to connect the cooling system 100 to a heat source. The radiator 130 may be any type of radiator or heat sink. In this example, the radiator 130 may be a fin pack, such as the one described in U.S. application Ser. No. 13/438,293 titled "Active Cooling Fin Pack," which is herein incorporated by reference.

The heat pipe is a device that transports heat from the heat spreader 110 to the radiator 130. The heat pipe 120 may have a first end portion 122, a mid-portion 124, and a second end portion 126. The mid-portion 126 is thicker than both end portions. Configuring the heat-pipe 120 to have thinner end portions enables it to be stacked over device components inside device enclosures that have limited vertical clearance. At the same time, having a thicker mid-portion enables the heat pipe 120 to retain a sufficiently low thermal resistance to remove heat from the device's components at a sufficient rate.

Figure 1C:
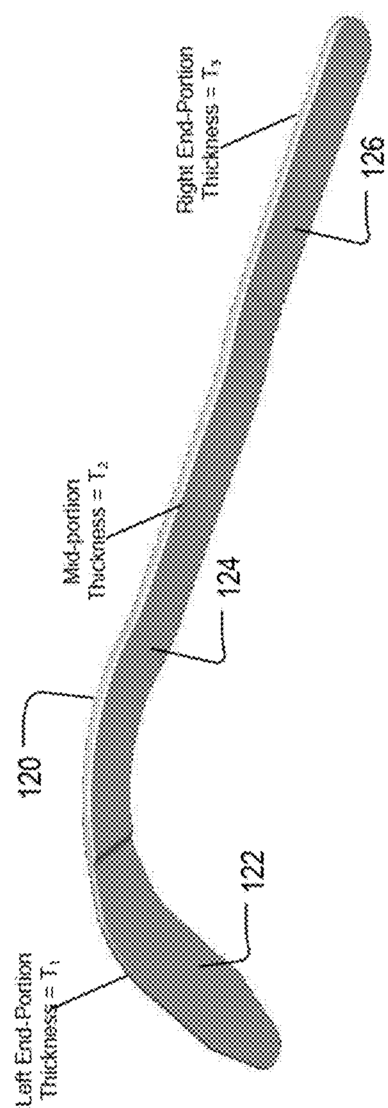
FIG. 1C depicts a perspective view of a heat pipe the cooling system of FIG. 1 in accordance with one example.

In one aspect, the heat pipe 120 may have a variable thickness. As illustrated in FIG. 1C, the end portion 122 may have a thickness T1, the end portion 126 may have a thickness T2, and the mid-portion may have a thickness T3, wherein T1≠T2≠T3. In this example, T1=1.0*L mm, T2=1.3*L mm, and T3=1.5*L mm, wherein L is an integer greater than or equal to 1. The mid-portion 120 may have an arced shape, or alternatively, it may have a substantially flat shape.

In another aspect, the end portion 122, the mid-portion 124, and the end portion 126 may extend longitudinally along a midline M. Although in this example, as shown in FIG. 1C, the end portions 122 and 126, and the mid-portion 124 are arranged along the midline so as to define J-shape, in other examples, the end portions and the mid-line may be arranged in the shape of a straight line. In the latter examples, the mid-line M is a straight line and not a curved line, as is the case in this example.

Figure 2A:
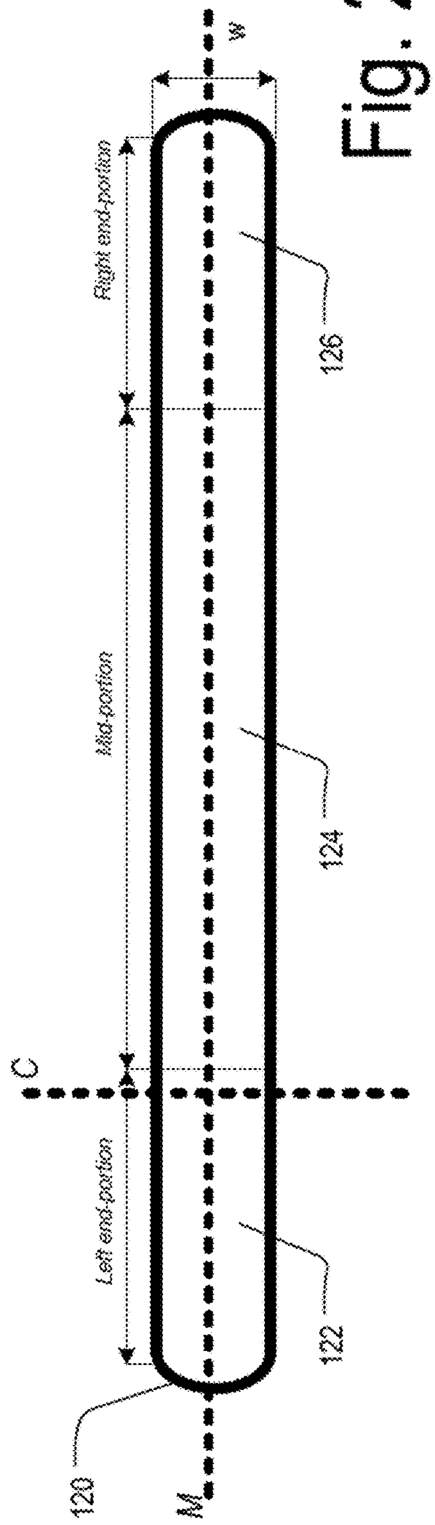
FIG. 2A depicts a top view of the heat pipe of the cooling system of FIG. 1A in accordance with another aspect of the disclosure.
Figure 2B:
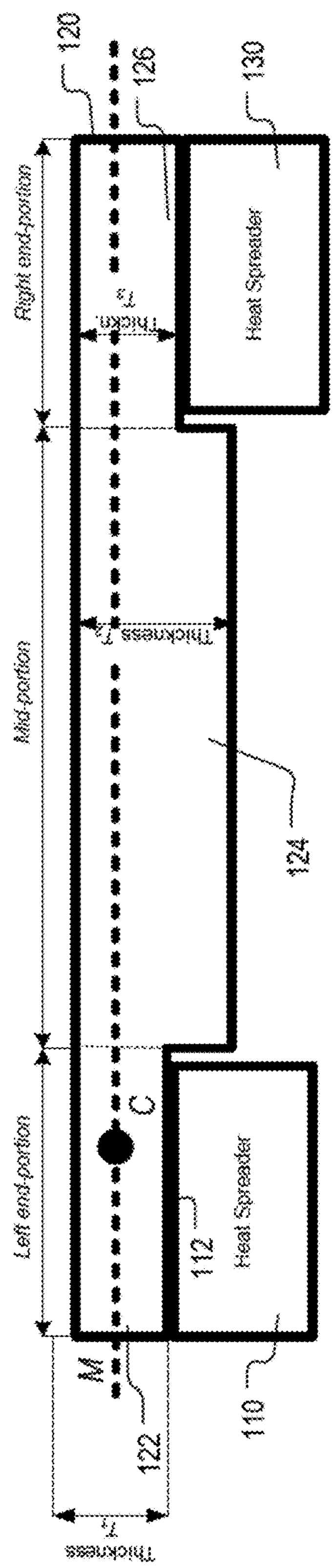
FIG. 2B depicts a side view of the heat pipe of FIG. 2A.

FIGS. 2A-F depict the heat pipe 120 in accordance with an example where the mid-portion and end portions are arranged in a straight line. Specifically, FIG. 2A depicts a top-down view of the heat pipe 120 illustrating that the heat pipe 120 may have a substantially uniform width W. FIG. 2B depicts a first side view of the heat pipe 120 showing that the heat pipe 120 may have a variable thickness. As illustrated, the end portion 122 may be connected to a surface 112 of the heat spreader 110 and it may extend substantially up to an edge 114 of the surface. The mid-portion 124 may begin where the end portion 122 ends. Furthermore, the mid-portion 124 may jut down below the edge 114 starting at the location where the mid-portion 124 begins.

Figure 2C:
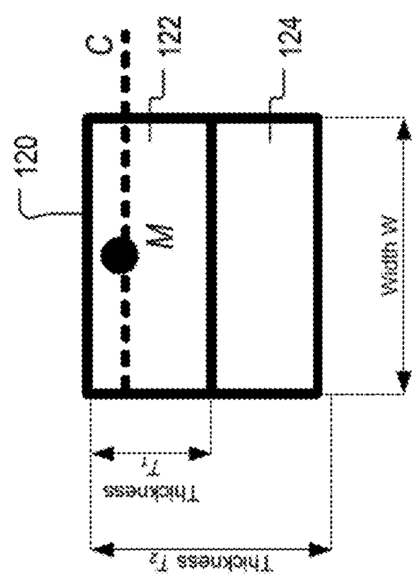
FIG. 2C depicts a side view of the heat pipe of FIG. 2A.
Figure 2D:
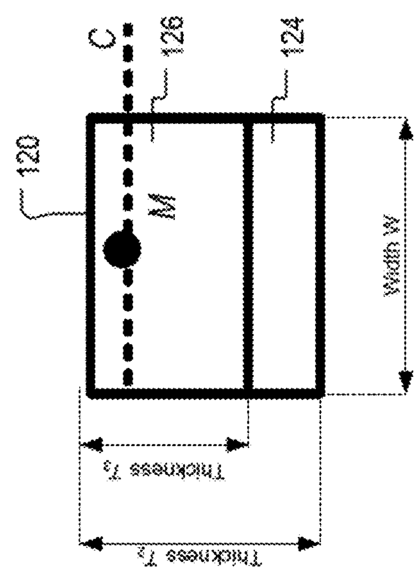
FIG. 2D depicts a side view of the heat pipe of FIG. 2A.

FIGS. 2C-D depict side views of the heat pipe 120 illustrating that the end portion 126 may be thicker than the end portion 124. Furthermore, as noted above, FIGS. 2C-D illustrate that the heat pipe 120 may have a uniform width with the end portions 124 and 126, and the mid-portion 124 having substantially the same width. In other examples, however, the end portions 124 and 126 and the mid-portion 124 may have different widths.

Figure 2E:
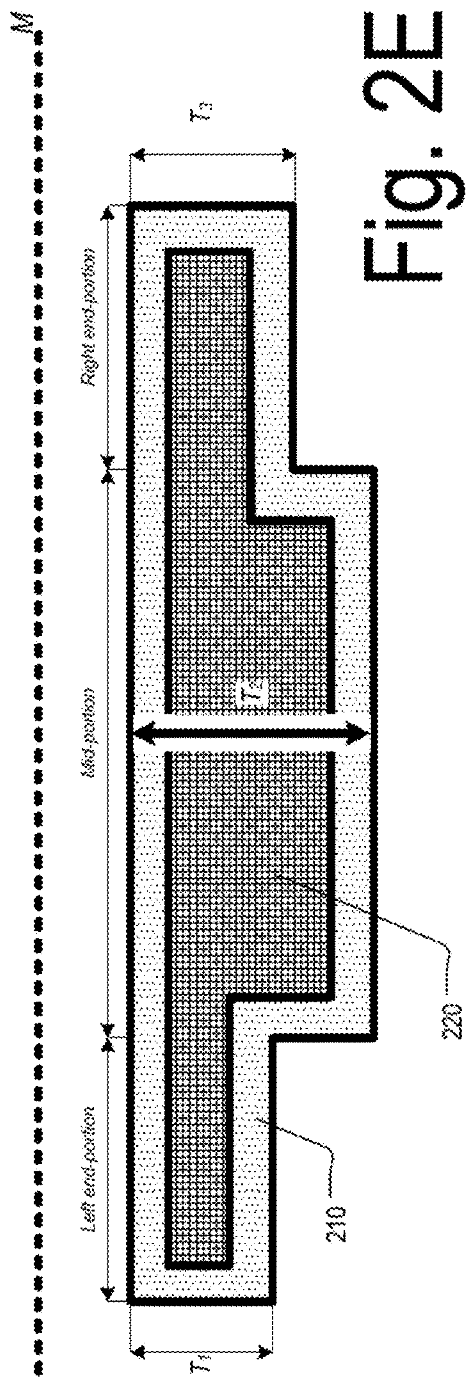
FIG. 2E depicts a cross-sectional view of the heat pipe of FIG. 2A.
Figure 2F:
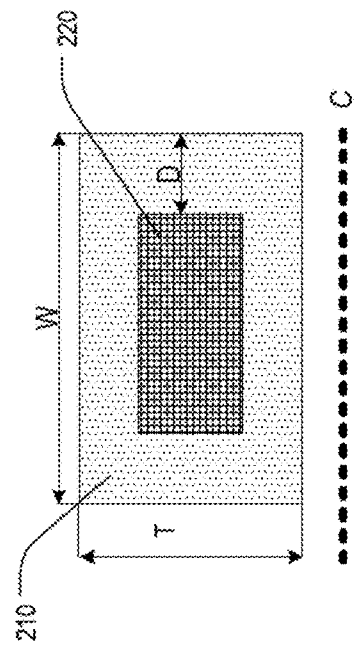
FIG. 2F depicts another cross-sectional view of the heat pipe of FIG. 2A.

FIG. 2E-F depict cross-sectional views of the heat-pipe 120 in accordance with aspects of the disclosure. FIG. 2E depicts a cross-sectional view of the heat pipe 120 along the midline M and FIG. 2F depicts a cross-sectional view of the heat pipe 120 along an axis C. As illustrated, the heat pipe 120 includes a casing 210, a wick 220 disposed inside the casing, and a working fluid (not shown), also disposed inside the casing 210. In one aspect, the casing may be a tube-like metal structure having circular, rectangular, or any other shape of cross-section. In another aspect, the casing 210 may be a monolithic structure that defines all of the end portion 122, the mid-portion 124, and the end portion 126. Although in this example, the casing has a uniform wall thickness D, in other examples, the casing may have a variable wall thickness. For example, the end portions of the heat-pipe 120 may have thinner walls than the mid-portion 124. The wick 220 may be a metal mesh, sinder, or any other type of wick suitable for use in heat pipes. In this example, the wick may be a 6 mm×160 mm wire mesh wick.

In operation, the wick 220 may use capillary action to move the working fluid from the end portion 126 to the end portion 122. Once at the end portion 124, the fluid may be evaporated by heat received from the heat spreader 110 and travel back to the end portion 126, driven by a pressure differential between the end portions 122 and 126. By the time the vapor reaches the end portion 126, it is expected to have liquefied and be ready to be transported back to the end portion 122 for a repetition of the same cycle.

Figure 3A:
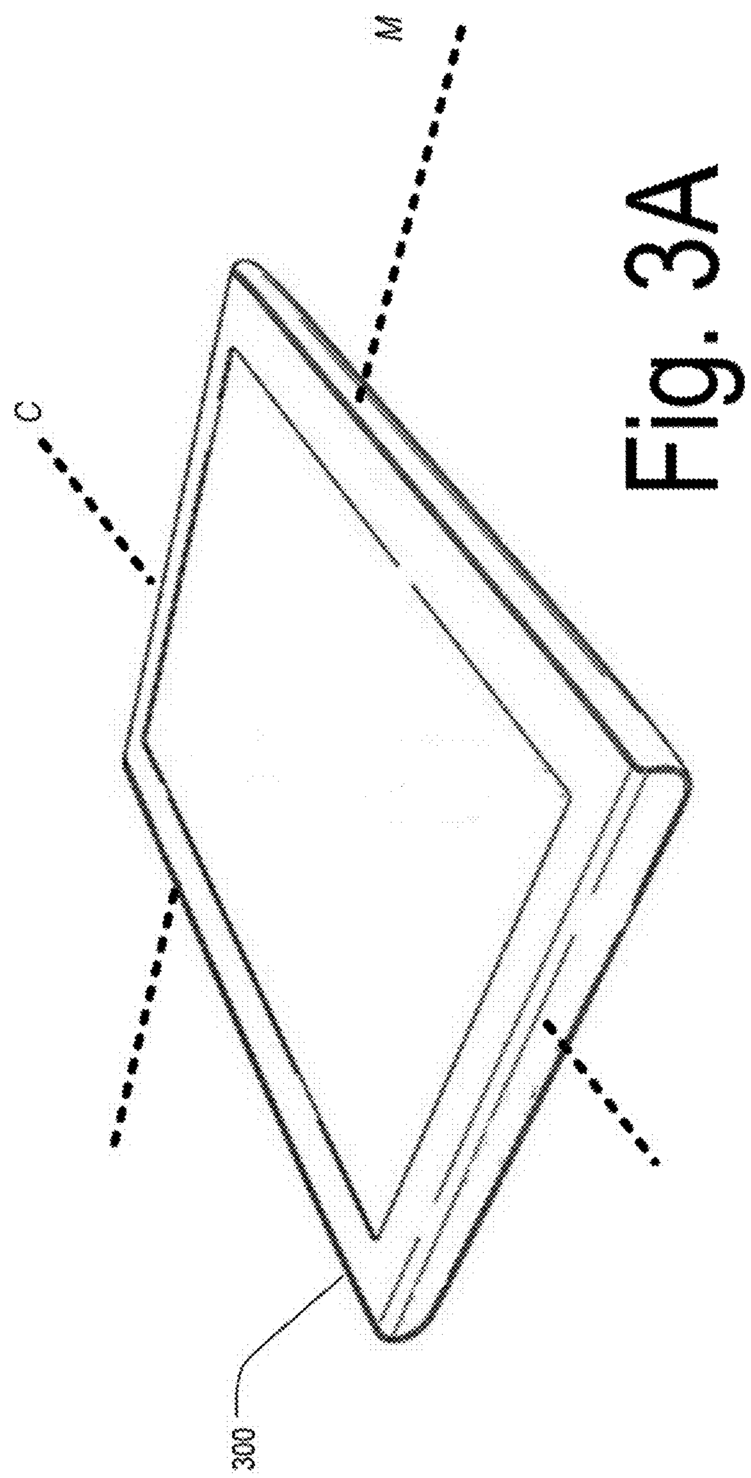
FIG. 3A depicts a computing device that might utilize the cooling system of FIG. 1A.
Figure 3B:
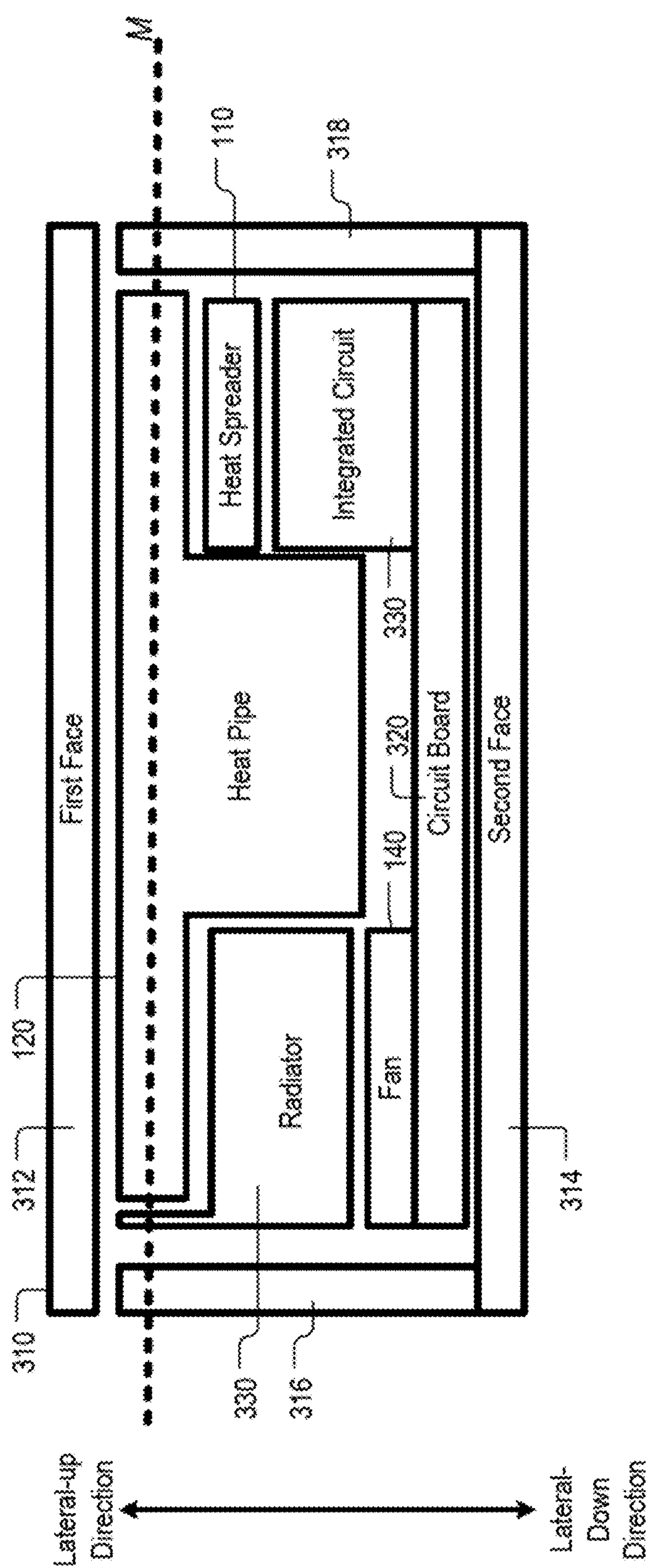
FIG. 3B depicts a cross-sectional view of the computing device of FIG. 3A.

FIG. 3A depicts an example of a device 300 where the cooling system 100 may be used. In this example, the device 300 is a tablet computer, but in other examples, the device 300 may be a smart phone, a laptop, or any other computing device. FIG. 3B depicts a cross-sectional view of the device 300 along the midline M. The device 300 includes an enclosure 310, a system board 320, an integrated circuit 330, the heat spreader 110, the fan 140, and the radiator 130.

The enclosure 310 may include a face 312, a face 314, a side-wall 316, and a side-wall 318. The face 312 may include a display screen (e.g., LCD), a keyboard, a mouse pad, or any other interface device. Alternatively, the face 312 may be a plastic or metal panel, without any interface components built-in, that is used to protect the device 300 from physical damage. Similarly, the face 314 may include a display screen (e.g., LCD), a keyboard, a mousepad, or any other interface device. Alternatively, the face 314 may be a plastic or metal panel, without any interface components built-in, that is used to protect the device 300 from physical damage. In this example, the face 314 includes an LCD screen and the face 312 is a plastic panel.

The circuit board 320 may be a motherboard, a network interface board, or any other substrate base on which at least one of the radiator 130 and the integrated circuit 130. The integrated circuit 330 may be a CPU, GPU, another integrated circuit, or any other heat source that is part of the device 300. The integrated circuit 330 may be stacked on the circuit board 320, and the heat spreader 110 may be stacked on the integrated circuit 330. Similarly, the fan 140 may be stacked on the circuit board 320 and the radiator 130 may be placed atop the fan 140.

Thus, two separate stacks, separated by some distance from one another, may protrude from the circuit board 320. The heat pipe 120 may be placed atop the two stacks, with the mid-portion 124 occupying free space between the two stacks. The mid-portion 126 may extend towards the system board 320 below the end portions 122 and 126 in order take advantage of free space that is available space between the two stacks.

Figure 3C:
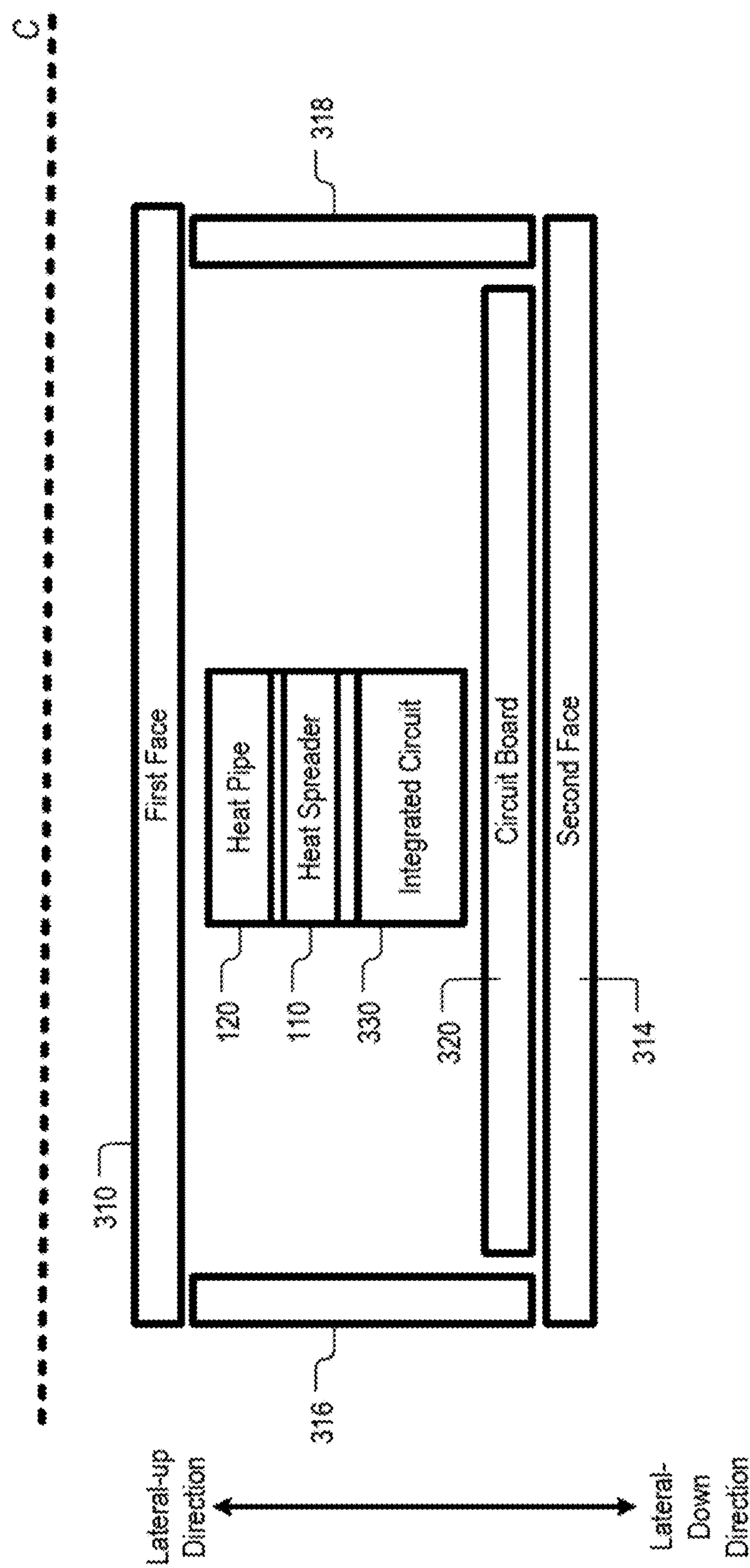
FIG. 3C depicts another cross-sectional view of the computing device of FIG. 3A.

FIG. 3C illustrates a cross-section of the device 100 along an axis C. Together, FIGS. 3B and 3C illustrate that the midline M of the heat pipe 120, the faces 312 and 314, and the circuit board 320 may be substantially parallel to one another. Furthermore, the mid-portion 124 and the end portions 122 and 126 may extend a different distance towards the circuit board 320 and the face 314 while extending substantially the same distance towards the face 312. Similarly, as the mid-portion 124 and the end portions 122 and 124 may extend the same distance in the directions parallel to the circuit board 320 and the faces 312-314.

In one aspect, having a thicker mid-portion increases the cooling capacity of the cooling system 100 by reducing the heat pipe's 120 thermal resistance. In general, the thinner the heat pipe 120, the greater its thermal resistance. On the other hand, the thicker the heat pipe 120, the more difficult it is to fit the heat pipe inside the enclosure 310. In that regard, the thickness the end portion 122 may be reduced so that it fits in the space between the heat spreader 110 and the face 312. Reducing the thickness of only a limited portion of the heat pipe 120 (e.g., end portion 122), while keeping the mid-portion 124 thicker than the mid-portion 122, may help maintain the thermal resistance of the heat pipe 120 at an acceptable level.

In another aspect, the rate at which the cooling system 100 dissipates heat may be optimized by enlarging the radiator 130 at the cost of making the end portion 126 thinner. Making the end portion 126 thinner may be necessary, if the thickness of the radiator 130 were to be increased, because of limited space available between the circuit board 320 and the face 312. On one hand, making the end portion thinner than the mid-portion 124, may increase the thermal resistance of the heat pipe 120 thereby causing it to remove heat from the integrated circuit 330 at a slower rate. On the other hand, however, in instances where the radiator 130 is a fin pack such as the one discussed above, increasing the size of the radiator may raise the rate at which heat is removed by the cooling system 100 from the integrated circuit 330. The increase in the heat dissipation rate resulting from the enlargement of the radiator 130 may offset some of the negative impact on the heat dissipation rate of the system 100 resulting from thinning the end portion 130. This is especially so because the fin pack features can be generally adjusted to increase their surface area to improve the heat transfer rate.

FIGS. 1A-3C are provided as examples. Although in the above examples, the heat pipe 120 is depicted as being placed atop the radiator 130, in other examples it may be inserted into the radiator or placed underneath the radiator. As these and other variations and combinations of the features discussed above can be utilized without departing from the subject matter as defined by the claims, the foregoing description of exemplary aspects should be taken by way of illustration rather than by way of limitation of the subject matter as defined by the claims. It will also be understood that the provision of the examples described herein (as well as clauses phrased as "such as," "e.g.", "including" and the like) should not be interpreted as limiting the claimed subject matter to the specific examples; rather, the examples are intended to illustrate only some of many possible aspects.

The invention claimed is:

1. A cooling assembly, comprising:

a discrete heat spreader;

a radiator;

and a heat pipe coupling the heat spreader and the radiator, the heat pipe including:

a first end portion connected to the heat spreader, the first end portion having a first substantially uniform thickness, a second end portion connected to the radiator, the second end portion having a second substantially uniform thickness, and a mid-portion located between the first end portion and the second-end portion, the mid-portion having a third substantially uniform thickness that is greater than the first thickness and the second thickness, wherein the first end portion, the second end portion, and the mid-portion have a substantially uniform width.

2. The cooling assembly of claim 1, wherein the first end portion, the second end portion, and the mid-portion are arranged co-linearly.

3. The cooling assembly of claim 1, wherein the first thickness is equal to 1 L mm, the second thickness is equal to 1.3 L mm, and the third thickness is equal to 1.5 L mm, wherein L is an integer greater than or equal to 1.

4. The cooling assembly of claim 1, wherein the heat pipe further includes a casing having a uniform wall thickness and a wick enclosed in the casing.

5. The cooling assembly of claim 1, wherein the heat pipe further includes a casing having a variable wall thickness and a wick enclosed in the casing, wherein the casing has a greater wall thickness in the mid-portion of the heat pipe than in the either one of the first end portion and the second end portion.

6. The cooling assembly of claim 1, wherein:

the first end portion is disposed on a surface of the heat spreader;

the first end portion extends substantially up to an edge of the heat spreader where the surface ends; and the mid-portion juts below the edge of the heat spreader starting at a location on the heat pipe where the first end portion ends and the mid-portion begins.

7. The cooling assembly of claim 1, wherein the second thickness of the second end portion is greater than the first thickness of the first end portion.

8. An apparatus comprising:

an enclosure having a first face and a second face opposite the first face;

a heat-generating component disposed inside the enclosure between the first face and the second face;

a radiator disposed inside the enclosure between the first face and the second face;

a discrete heat spreader that is in thermal contact with the heat generating component, the heat spreader being disposed between the heat generating component and the top face; and a heat pipe including:

a first end portion connected to the heat spreader, the first-end portion being disposed on the heat spreader and between the heat spreader and the first face, the first end portion having a first substantially uniform thickness, a second end portion extending connected to the radiator, and the second end portion having a second substantially uniform thickness, and a mid-portion connecting the first end portion and the second-end portion, the mid-portion having a third substantially uniform thickness that is greater than either one of the first thickness and the second thickness, wherein the first end portion, the second end portion, and the mid-portion have a substantially uniform width.

9. The apparatus of claim 8, wherein the first end portion, the second end portion, and the mid-portion are co-linear.

10. The apparatus of claim 8, wherein the first thickness is equal to 1 L mm, the second thickness is equal to 1.3 L mm, and the third thickness is equal to 1.5 L mm, wherein L is an integer greater than or equal to 1.

11. The apparatus of claim 8, wherein the heat pipe further includes a casing having a uniform wall thickness and a wick enclosed in the casing.

12. The apparatus of claim 8, wherein the heat pipe further includes a casing having a greater wall thickness in the mid-portion of the heat pipe than in the either one of the first end portion and the second end portion.

13. The apparatus of claim 8, wherein:

the first end portion is disposed on a surface of the heat spreader;

the first end portion extends substantially up to an edge of the heat spreader where the surface ends; and the mid-portion juts below the edge of the heat spreader starting at a location on the heat pipe where the first end portion ends and the mid-portion begins.

14. The apparatus of claim 8, wherein the second thickness of the second end portion is greater than the first thickness of the first end portion.

15. An apparatus comprising:

an enclosure having a first face and a second face opposite the first face;

a circuit board disposed between the first face and the second face;

a first stack, the first stack comprising:

one or more integrated circuits mounted on the circuit board; and a discrete heat spreader disposed on at least some of the one or more integrated circuits;

a second stack, comprising a radiator disposed inside the enclosure between the first face and the second face; and a heat pipe disposed between the first face and the second face, the heat pipe including:

a first end portion connected to the radiator on top of the second stack;

a second end portion connected to the heat spreader on top of the first stack; and a mid-portion connecting the first end portion and the second portion, the mid-portion having a substantially uniform thickness that is greater than a first thickness of the first end portion and a second thickness of the second end portion, between the first stack and the second stack towards a surface of the circuit board.

16. The apparatus of claim 15, wherein the mid-portion extends a same distance away from the surface of the circuit board as the first end portion and the second end portion.

17. The apparatus of claim 15, wherein the mid-portion extends a same distance in a direction parallel to the surface of the circuit board as the first end portion and the second end portion.

18. The apparatus of claim 15, wherein the heat pipe further includes:

a casing that defines the first end portion, the second end portion, and the mid-portion, the casing having a uniform wall thickness, and a wick enclosed in the casing.

* * * * *